(12) United States Patent
Lee et al.

(10) Patent No.: US 8,203,890 B2
(45) Date of Patent: *Jun. 19, 2012

(54) DATA OUTPUT BUFFER WHOSE MODE SWITCHES ACCORDING TO OPERATION FREQUENCY AND SEMICONDUCTOR MEMORY DEVICE HAVING THE SAME

(75) Inventors: Kyeong-Han Lee, Suwon-si (KR); Young-Joon Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 229 days.

This patent is subject to a terminal disclaimer.

(21) Appl. No.: 12/427,817

(22) Filed: Apr. 22, 2009

(65) Prior Publication Data
US 2009/0207670 A1    Aug. 20, 2009

Related U.S. Application Data

(63) Continuation of application No. 11/222,800, filed on Sep. 12, 2005, now Pat. No. 7,535,773.

(30) Foreign Application Priority Data

Apr. 4, 2005   (KR) .............................. 2005-0027878

(51) Int. Cl.
*G11C 7/10* (2006.01)
(52) U.S. Cl. .................................. 365/189.05; 365/191
(58) Field of Classification Search ............. 365/189.05, 365/191
See application file for complete search history.

(56) References Cited

U.S. PATENT DOCUMENTS

| | | | | |
|---|---|---|---|---|
| 5,488,580 A * | 1/1996 | Park | ......................... | 365/189.15 |
| 5,563,840 A | 10/1996 | Hayakawa et al. | | |
| 6,012,122 A * | 1/2000 | Choi et al. | ..................... | 711/105 |
| 6,094,376 A | 7/2000 | Park et al. | | |
| 6,160,742 A | 12/2000 | Chung et al. | | |
| 6,347,064 B1 | 2/2002 | Seo | | |
| 6,507,514 B1 * | 1/2003 | Tsao et al. | ............... | 365/185.17 |
| 6,597,630 B1 | 7/2003 | Kubo et al. | | |
| 6,714,051 B2 | 3/2004 | Takiba et al. | | |
| 6,987,705 B2 * | 1/2006 | Kim et al. | ..................... | 365/154 |
| 7,079,445 B2 | 7/2006 | Choi et al. | | |
| 7,535,773 B2 * | 5/2009 | Lee et al. | .................. | 365/189.05 |

FOREIGN PATENT DOCUMENTS

| | | |
|---|---|---|
| JP | 11144452 | 5/1999 |
| JP | 2003272394 | 9/2003 |
| JP | 2004086991 | 3/2004 |

* cited by examiner

*Primary Examiner* — Huan Hoang
*Assistant Examiner* — Kretelia Graham
(74) *Attorney, Agent, or Firm* — Volentine & Whitt, PLLC

(57) ABSTRACT

A data output buffer switches it operating mode according to its operating frequency. The data output buffer includes a delay control unit, and a buffer unit. The buffer unit provides data of an internal buffer input line to an external buffer output line. The delay control unit generates a buffer enable signal corresponding to a received reference control signal. The buffer unit blocks the provision of the data to the buffer output line in response to a deactivation of the buffer enable signal. The buffer enable signal remains in an activated state when the period of the reference control signal is shorter than a reference period. The data output buffer may be included in a semiconductor memory device.

25 Claims, 6 Drawing Sheets

T1 : LONG PERIOD OF RCON
T2 : SHORT PERIOD OF RCON

DATA OUTPUT BUFFER WHOSE MODE SWITCHES ACCORDING TO OPERATION FREQUENCY AND SEMICONDUCTOR MEMORY DEVICE HAVING THE SAME

CROSS-REFERENCE TO RELATED APPLICATIONS

This application is a continuation application of application Ser. No. 11/222,800 filed on 12 Sep. 2005, which is hereby incorporated for all purposes.

BACKGROUND OF THE INVENTION

1. Field of the Invention

The present invention relates generally to a semiconductor memory device and, more particularly, to a data output buffer and a semiconductor device having the same. This application claims priority from Korean Patent Application No. 10-2005-0027878 filed on 4 Apr. 2005, the entirety of which is hereby incorporated herein for all purposes as if fully set forth herein.

2. Description of the Related Art

A data output buffer outputs data from the inside of a chip to the outside of the chip. Commonly, only the output terminal of the data output buffer is referred to as a "data output driver." As the operational speed of a semiconductor memory device increases, the data output buffer operates in a corresponding operating mode.

In general, the data output modes of a semiconductor memory device may be classified into a normal output mode and an Extended Data Out (EDO) mode. The normal output mode, as shown in FIG. 1, is an operating mode that outputs data from a buffer input line IDIO inside a chip to a buffer output line EDIO outside the chip in response to a reference control signal RCON. In the normal output mode, the provision of data from the inside of a chip to the outside of the chip starts in response to the leading edge of a reference control signal RCON. In contrast, the provision of data from the inside of the chip to the outside of the chip is blocked in response to the lagging edge of the reference control signal DCON. Accordingly, the normal output mode is advantageous in that, while the provision of data to the outside of the chip is being blocked, the buffer output line EDIO can be pre-charged or used for other purposes. Meanwhile, the normal output mode can be effectively used in the case where the operating period of the semiconductor memory device is relatively long (that is, the case of a low-frequency operating mode).

In contrast, the EDO mode, as shown in FIG. 2, is an operating mode that provides data from the buffer input line IDIO inside the chip to the buffer output line EDIO outside the chip regardless of the state of the reference control signal RCON. That is, in the EDO mode, as soon as data are received from the buffer input line IDIO inside the chip, the data are provided to the buffer output line EDIO. This EDO mode can be effectively used in the case where the operating period of the semiconductor memory device is relatively short (that is, the case of a high-frequency operating mode).

FIG. 3 is a block diagram showing a conventional data output buffer. In the data output buffer of FIG. 3, an operating mode is determined by an additionally provided mode selection signal MSEL. Accordingly, the conventional data output buffer has a problem in that it requires a structure for receiving the mode selection signal MSEL and for switching its operating based on the mode selection signal MSEL, so that the construction of a related circuit is complicated. Furthermore, in a semiconductor memory device containing the conventional data output buffer shown in FIG. 3, a separate circuit for generating the mode selection signal MSEL is required.

Accordingly, it would be desirable to provide a data output buffer whose operating mode can be controlled without a separate mode selection signal. It would also be desirable to provide a semiconductor memory device including such a data output buffer.

SUMMARY OF THE INVENTION

In one aspect of the invention, a data output buffer comprises: a buffer providing data which are received from a buffer input line to a buffer output line when the buffer is in an activated state, wherein the data output buffer receives a reference control signal and retains the activated state of the buffer when a period of the reference control signal is shorter than a reference period.

In another aspect of the invention, a semiconductor memory device comprises: a memory array including a plurality of memory cells; and a data output buffer adapted to output data of a buffer input line read from a selected memory cell of the plurality of memory cells of the memory array to a buffer output line when the data output buffer is activated, wherein the data output buffer receives a reference control signal and retains an activated state of the data output buffer when a period of a reference control signal is shorter than a reference period.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
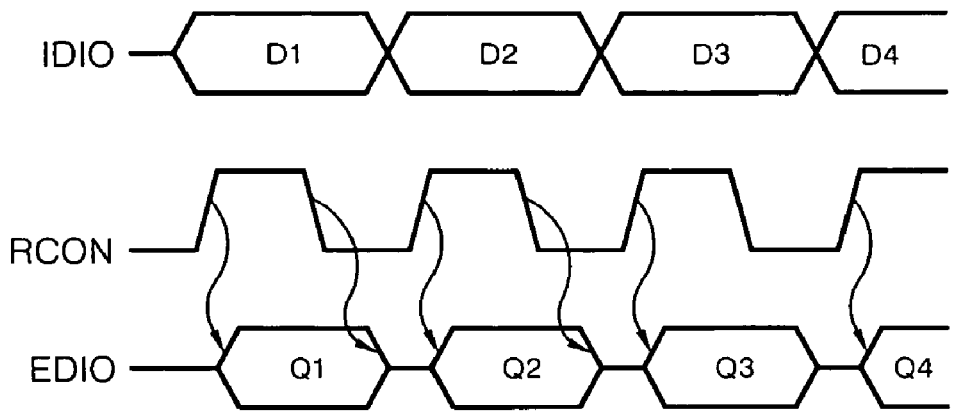
FIG. 1 is a timing diagram showing data output in a general normal output mode.
Figure 2:
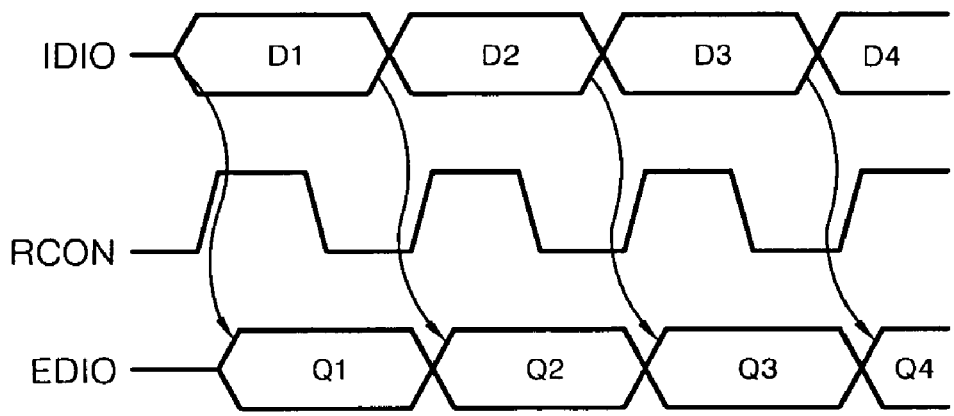
FIG. 2 is a timing diagram showing data output in a general EDO mode.
Figure 3:
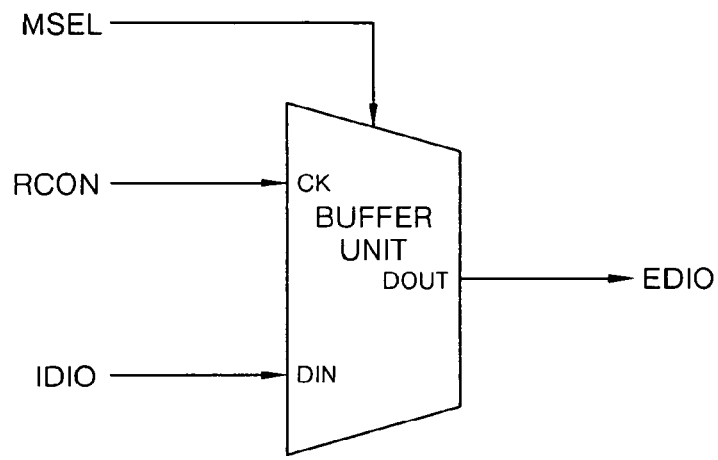
FIG. 3 is a block diagram showing a conventional data output buffer.

Reference now should be made to the drawings, in which the same reference numerals are used throughout the different drawings to designate the same or similar components.

The present invention is described in detail below by describing preferred embodiments of the present invention with reference to the accompanying drawings.

Figure 4:
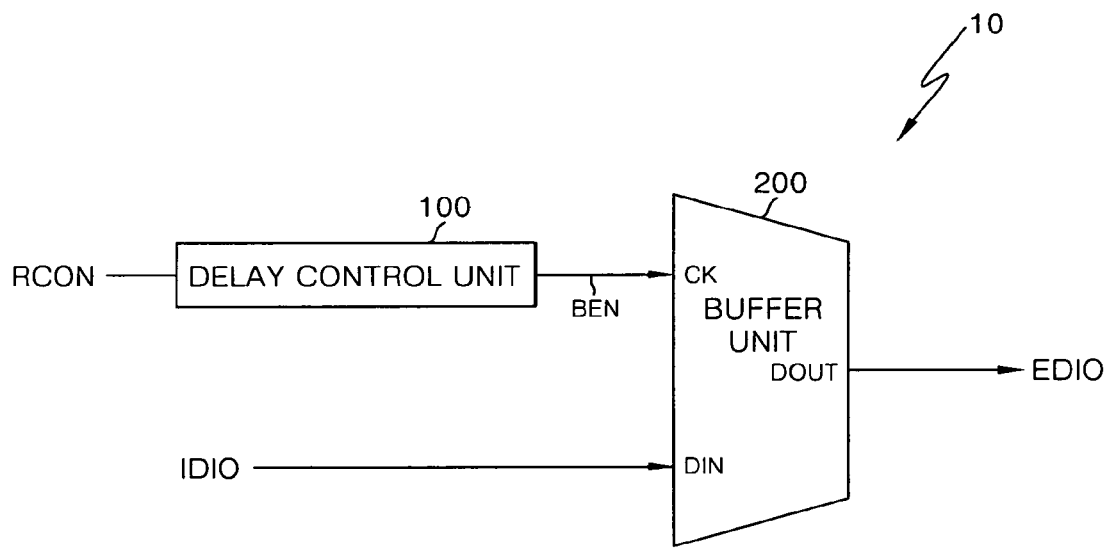
FIG. 4 is a diagram showing a data output buffer according to one or more aspects of the present invention.

FIG. 4 is a diagram showing a data output buffer 10. The data output buffer 10 performs control so that data can be provided from a buffer input line IDIO inside a chip to a buffer output line EDIO outside the chip.

Referring to FIG. 4, the data output buffer 10 includes a delay control unit 100 and a buffer unit 200. The delay control unit 100 generates a buffer enable signal BEN corresponding to a received reference control signal RCON. At this time, when the period of the reference control signal RCON is shorter than a predetermined reference period, the buffer enable signal BEN remains in an activation state (in the present embodiment, a logic "H" state).

Preferably, the buffer enable signal BEN is activated in response to the leading edge of the reference control signal RCON. Additionally, the buffer enable signal BEN is deactivated in delayed response to the lagging edge of the reference control signal RCON. However, when the period of the reference control signal RCON is shorter than the predetermined reference period, the deactivation of the buffer enable signal BEN is blocked.

Figure 5:
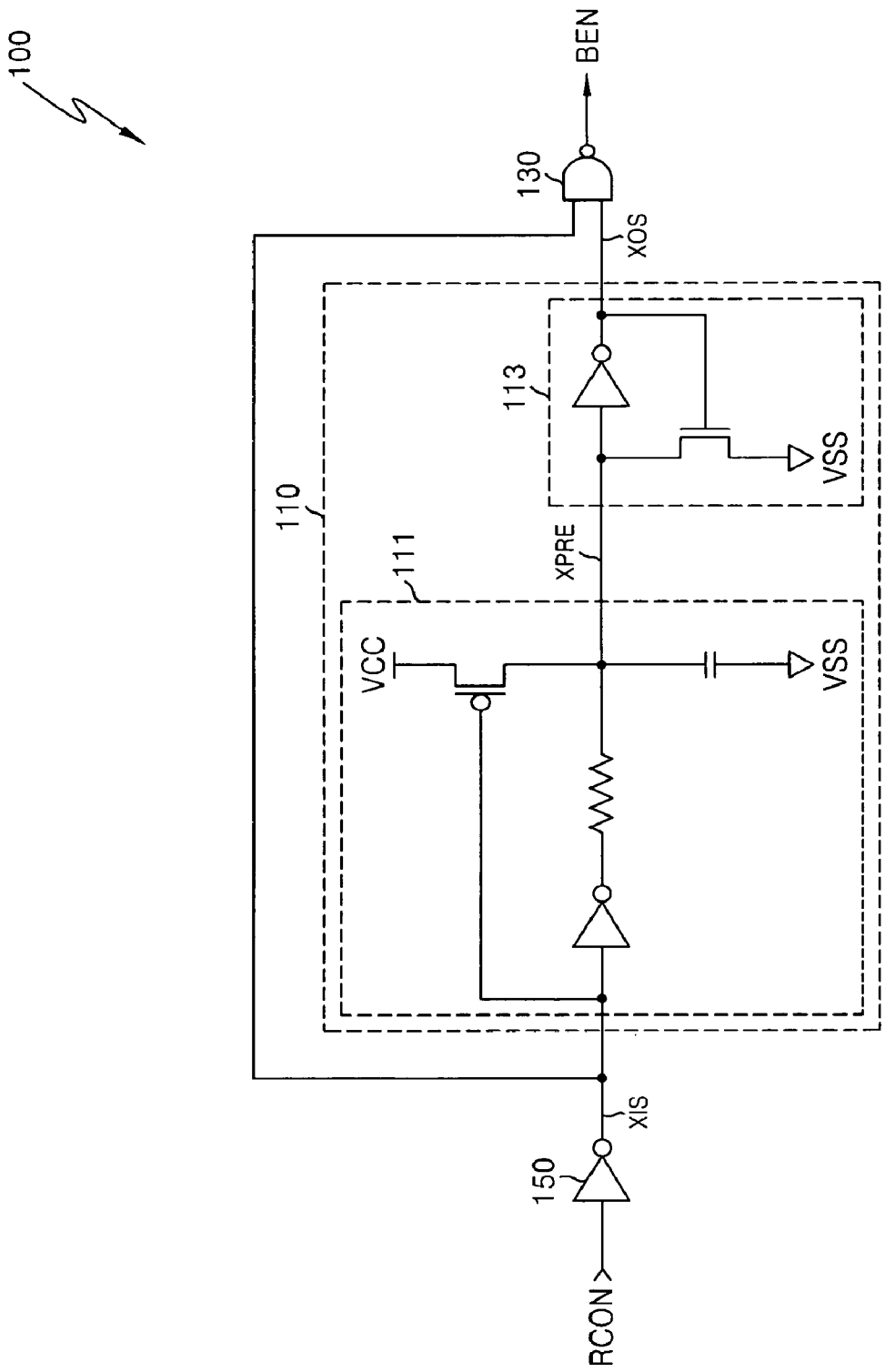
FIG. 5 is a detailed circuit diagram of one embodiment of the delay control unit of FIG. 4I.

FIG. 5 is a detailed circuit diagram showing an embodiment of the delay control unit 100 of FIG. 4. Referring to FIG. 5, the delay control unit 100 includes a unidirectional delay means 110 and a logical operation means 130.

The unidirectional delay means 110 generates an output auxiliary signal XOS in response to the leading edge of an input auxiliary signal XIS, which is linked to the reference control signal RCON. Additionally, the lagging edge of the output auxiliary signal XOS responds to the lagging edge of the input auxiliary signal XIS in a delayed manner.

In the present embodiment, the input auxiliary signal XIS is the inverted reference control signal RCON. Accordingly, the leading edge of the input auxiliary signal XIS is a falling edge, and is generated in response to the leading edge of the reference control signal RCON (in the present embodiment, in response to a rising edge of the reference control signal RCON).

The unidirectional delay means 110 includes a unidirectional delay element 111 and latch element 113. The unidirectional delay element 111 generates a preparatory signal XPRE in response to the leading edge of the input auxiliary signal XIS. Meanwhile, the lagging edge of the preparatory signal XPRE responds to the lagging edge of the input auxiliary signal XIS in a delayed manner. The latch element 113 latches the preparatory signal XPRE and, ultimately, generates the output auxiliary signal XOS.

Meanwhile, the logical operation means 130 performs an AND operation on the input auxiliary signal XIS and the output auxiliary signal XOS and, ultimately, generates the buffer enable signal BEN. In the present embodiment, the logical operation means 130 is implemented using a NAND gate.

Figure 6:
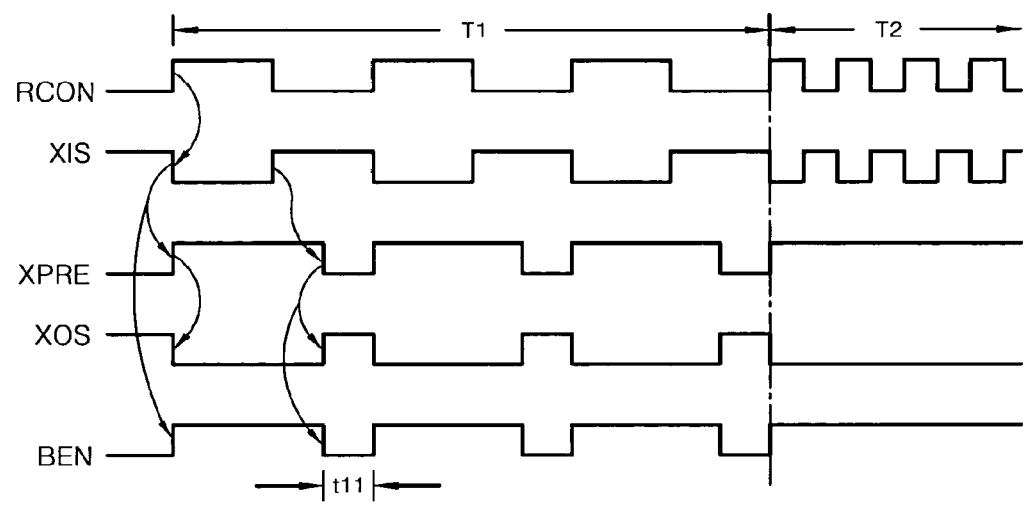
FIG. 6 is a timing diagram for principal signals in the delay control unit of FIG. 5.

FIG. 6 is a timing diagram for principal signals in the delay control unit 100 of FIG. 5, which indicates that the deactivation of the buffer enable signal BEN is blocked when the period of the reference control signal RCON is shorter than the certain reference period. In FIG. 6, interval T1 indicates the case where the period of the reference control signal RCON is longer than a reference period, and interval T2 indicates that the period of the reference control signal RCON is shorter than the reference period.

With reference to FIGS. 5 and 6, the operation and effect of the delay control unit 100 are described. The operation in interval T1 is described first. The input auxiliary signal XIS results from the inversion of the reference control signal RCON. Now, the transition of the preparatory signal XPRE to a high logic level "H" is made in response to the transition of the input auxiliary signal XIS to a low logic level "L" (which, in turn, occurs in response to the leading edge of the reference control signal RCON). Meanwhile, the transition of the preparatory signal XPRE to the low logic level "L" is made in delayed response to the transition of the input auxiliary signal XIS to the high logic level "H", (which, in turn, occurs in response to the lagging edge of the reference control signal RCON). That is, the preparatory signal XPRE transitions to the low logic level "L" in response to the input auxiliary signal XIS transitioning to the high logic level "H," but only after a certain delay time occurs. Furthermore, the output auxiliary signal XOS is the inverted preparatory signal XPRE.

As a result, in interval T1, the buffer enable signal BEN is activated to the high logic level "H" in response to the transition of the reference control signal RCON to the high logic level "H", and is deactivated to the low logic level "L" in delayed response to the transition of the reference control signal RCON to the low logic level "L". Accordingly, in the case of interval T1, a period t11, in which the buffer enable signal BEN has been deactivated, occurs.

Meanwhile, the operation in interval T2 is described below. Before the preparatory signal XPRE makes a transition to the low logic level "L" in delayed response to the input auxiliary signal XIS transitioning to the high logic level "H," the input auxiliary signal XIS makes a transition back to the low logic level "L" again. Accordingly, the transition of the preparatory signal XPRE to the low logic level "L" does not occur. As a result, the transition of the buffer enable signal BEN to the low logic level "L" does not occur either, and the buffer enable signal BEN remains in an activated state at the high logic level "H".

Referring to FIG. 4 again, the buffer unit 200 provides data from the buffer input line IDIO to the buffer output line EDIO while the buffer enable signal BEN is in the state of having been activated to the high logic level "H". Furthermore, the provision of data to the buffer output line EDIO is blocked in response to the deactivation of the buffer enable signal BEN to the low logic level "L".

Beneficially, the buffer unit 200 provides data, which are obtained by performing an AND operation on the buffer enable signal BEN and the data of the buffer input line IDIO, ultimately to the buffer output line EDIO. More beneficially, the buffer unit 200 is an AND gate that performs an AND operation on the buffer enable signal BEN and the data of the buffer input line IDIO and provides the result of the AND operation to the buffer output line EDIO.

Figure 7:
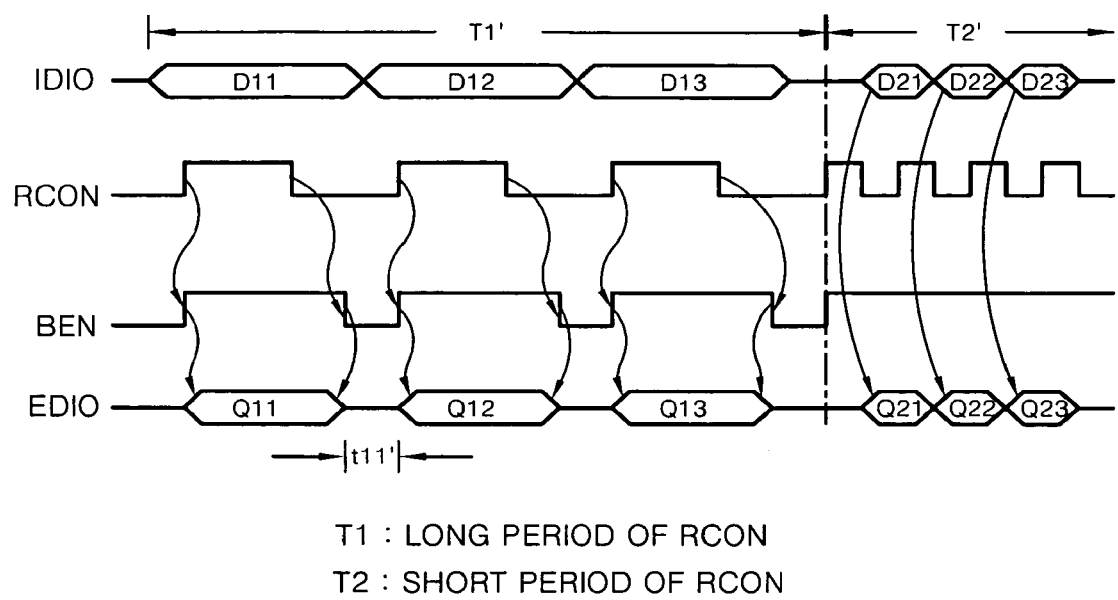
FIG. 7 is a timing diagram illustrating a process of data output in the data output buffer of FIG. 4.

FIG. 7 is a timing diagram illustrating a process of inputting data in the data output buffer 10 of FIG. 4. As described above, in the case of interval T1' in which the period of the reference control signal RCON is longer than the certain reference period, section t11', in which the buffer enable signal BEN has been inactivated to the low logic level "L", occurs.

Accordingly, in interval T1', the provision of data from the inside of the chip to the outside of the chip starts in response to the leading edge of the reference control signal RCON. Furthermore, in response to the lagging edge of the reference control signal RCON, the provision of data from the inside of the chip to the outside of the chip is blocked. That is, in interval T1', the data output buffer 10 operates in a 'normal output mode' of outputting data from the buffer input line IDIO inside the chip to the buffer output line EDIO outside the chip in response to the reference control signal RCON. In interval T1', during the period t11' the buffer output line EDIO outside the chip may be pre-charged or used for other purposes while the provision of data to the outside of the chip is in the state of having been blocked.

In contrast, in the case of interval T2' in which the period of the reference control signal RCON is shorter than the certain reference period, the buffer enable signal BEN retains the state of having been activated to the high logic level "H". Accordingly, in interval T2', the data output buffer 10 operates in an "EDO mode" of providing data to the buffer output line EDIO outside the chip as soon as the data are received from the buffer input line IDIO inside the chip, regardless of the state of the reference control signal RCON.

In the data output buffer 10 the operating mode switches according to the period (frequency) of the reference control signal RCON, even though the mode selection signal is not provided. In other words, the data output buffer 10 operates in the 'normal output mode' when the operation period is long, that is, when the data output buffer 10 operates at a low frequency, whereas the data output buffer 10 operates in the 'EDO mode' when the operation period is short, that is, when the data output buffer 10 operates at a high frequency. Accordingly, the data output buffer can be implemented as a considerably simple construction, compared to the conventional data output buffer.

Figure 8:
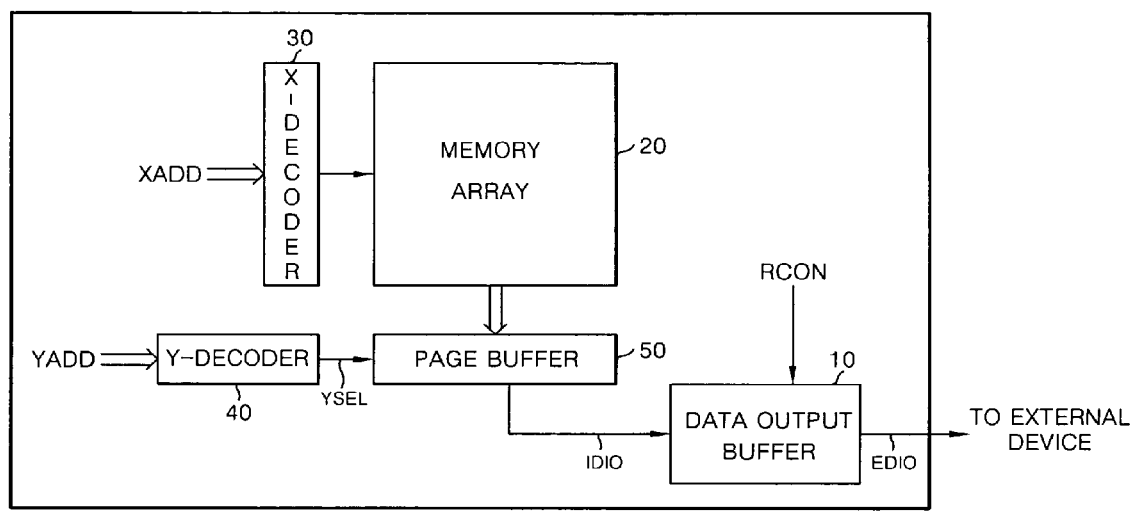
FIG. 8 is a semiconductor memory device in which the data output buffer of FIG. 4 is included.

Meanwhile, the data output buffer 10 may be usefully applied to the semiconductor memory device shown in FIG. 8. Referring to FIG. 8, the semiconductor memory device includes a data output buffer 10, a memory array 20, an X-decoder 30 and an Y-decoder 40.

The memory array 20 includes a plurality of memory cells in a matrix that is formed by rows and columns. The X-decoder 30 decodes a certain row address XADD and selects a row of the memory array 20. The Y-decoder 40 decodes a certain column address YADD and, ultimately, selects a column of the memory array 20.

The data output buffer 10 controls the data of the buffer input line IDIO read from the memory cell of the memory array 20 specified by the X-decoder 30 and the Y-decoder 40, and provides the data to the buffer output line EDIO. Furthermore, in the data output buffer 10, the provision of data from the buffer input line IDIO to the buffer output line EDIO may be blocked in response to the certain reference control signal RCON as described above, but the provision of the data is prevented from being blocked when the period of the reference control signal RCON is shorter than an established reference period.

Preferably, the semiconductor memory device of FIG. 8 is flash memory further including a page buffer 50. The page buffer 50 latches data read from the memory array 20. Furthermore, the data latched by the page buffer 50 are provided to the data output buffer 50 in response to a row selection signal YSEL provided from the Y-decoder 40.

The semiconductor memory device shown in FIG. 8 contains a data output buffer 10 whose operating mode switches according to frequency. Accordingly, the semiconductor memory device does not need to contain an additional circuit for generating a mode selection signal selecting one from among the EDO mode and the normal output mode. Accordingly, the construction of the semiconductor memory device can be considerably simplified.

In the data output buffer as disclosed above, the operating mode of the data output buffer switches according to the period of the reference control signal RCON even though no mode selection signal is additionally provided. That is, the data output buffer operates in the 'normal output mode' when the operation period of the reference control signal RCON is long, and operates in the 'EDO' mode when the operation period is short. Accordingly, the data output buffer can be implemented as a considerably simple construction, compared to the conventional data output buffer.

Furthermore, the semiconductor memory device containing the data output buffer as disclosed above does not need to contain an additional circuit for generating a mode selection signal selecting one of the EDO mode and the normal output mode. Accordingly, the semiconductor memory device can also be implemented as a considerably simple construction.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data output buffer comprising:
  a buffer input line;
  a buffer output line; and
  a buffer providing data which are received from the buffer input line to the buffer output line when the buffer is in an activated state,
  wherein the data output buffer receives a reference control signal and retains the activated state of the buffer when a period of the reference control signal is shorter than a reference period, and
  wherein the data output buffer retains the activated state of the buffer regardless of the state of the reference control signal when the period of the reference control signal is shorter than the reference period and activates the buffer in response to the reference control signal when the period of the reference control signal is longer than the reference period.

2. The data output buffer of claim 1, wherein the data output buffer activates the buffer in response to a leading edge of the reference control signal and deactivates the buffer in response to a lagging edge of the reference control signal when the period of the reference control signal is longer than the reference period.

3. A data output buffer comprising:
  a buffer unit providing data which are received from a buffer input line to a buffer output line when the buffer unit is in an activated state, wherein the buffer unit is activated in response to a buffer enable signal,
  a control unit receiving a reference control signal and maintaining the buffer unit in an activated state for an entire period of the reference control signal when the period of the reference control signal is shorter than a reference period, and
  wherein the control unit maintains the buffer enable signal in the activated state regardless of the state of the reference control signal when the period of the reference control signal is shorter than the reference period and activates the buffer enable signal in response to the reference control signal when the period of the reference control signal is longer than the reference period.

4. The data output buffer of claim 3, wherein the control unit comprises:
  unidirectional delay means for activating the buffer enable signal in response to a leading edge of an input auxiliary signal produced from the reference control signal, maintaining the activated state of the buffer enable signal when the period of the reference control signal is shorter than the reference period and deactivating the buffer enable signal in response to a lagging edge of the input auxiliary signal when the period of the reference control signal is longer than the reference period.

5. The data output buffer of claim 3, wherein the buffer unit blocks provision of the data to the buffer output line when the buffer enable signal is deactivated.

6. A method of operating a data output buffer, comprising:
  receiving a reference control signal at the data output buffer;

when a period of the reference control signal is shorter than a reference period, maintaining the data output buffer in an activated state for an entire period of the reference control signal regardless of the state of the reference control signal when the period of the reference control signal is shorter than the reference period;

activating the data output buffer in response to the reference control signal when the period of the reference control signal is longer than the reference period; and providing data which are received from a buffer input line of the data output buffer to a buffer output line of the data output buffer when the data output buffer is in the activated state.

7. The method of operating the data output buffer of claim 6, wherein activating the data output buffer in response to the reference control signal when the period of the reference control signal is longer than the reference period, comprises:

activating the data output buffer in response to a leading edge of the reference control signal and deactivating the data output buffer in response to a lagging edge of the reference control signal when the period of the reference control signal is longer than the reference period.

8. The method of operating the data output buffer of claim 6, wherein retaining the activated state of the data output buffer when the period of the reference control signal is shorter than the reference period, comprises:

generating a buffer enable signal of the activated state when the period of the reference control signal is shorter than the reference period; and activating the buffer enable signal in response to the reference control signal when the period of the reference control signal is longer than the reference period.

9. A semiconductor memory device, comprising:

a memory array including a plurality of memory cells; and a data output buffer adapted to output data of a buffer input line read from a selected memory cell of the plurality of memory cells of the memory array to a buffer output line when the data output buffer is an activated state, wherein the data output buffer receives a reference control signal and, when a period of the reference control signal is shorter than a reference period, the data output buffer is maintained in the activated state for the entire period of the reference control signal, wherein the data output buffer is maintained in the activated state regardless of the state of the reference control signal when the period of the reference control signal is shorter than the reference period, and the data output buffer is activated in response to the reference control signal when the period of the reference control signal is longer than the reference period.

10. The semiconductor memory device of claim 9, wherein, when the period of the reference control signal is longer than the reference period, the data output buffer is activated in response to a leading edge of the reference control signal and the data output buffer is deactivated in response to a lagging edge of the reference control signal.

11. The semiconductor memory device of claim 9, wherein the data output buffer comprises:

a buffer unit providing the data of the buffer input line to the buffer output line when the buffer unit is in the activated state; and a control unit receiving the reference control signal and maintaining the buffer unit in the activated state when the period of the reference control signal is shorter than the reference period.

12. The semiconductor memory device of claim 11, wherein, when the period of the reference control signal is longer than the reference period, the control unit activates the buffer unit in response to a leading edge of the reference control signal and deactivates the buffer unit in response to a lagging edge of the reference control signal.

13. The semiconductor memory device of claim 11, wherein the buffer unit is activated in response to a buffer enable signal, and the buffer enable signal is in the activated state when the period of the reference control signal is shorter than the reference period.

14. The semiconductor device of claim 13, wherein the data output buffer maintains the activated state of the buffer enable signal regardless of the state of the reference control signal when the period of the reference control signal is shorter than the reference period, and activates the buffer enable signal in response to the reference control signal when the period of the reference control signal is longer than the reference period.

15. The semiconductor memory device of claim 14, wherein the data output buffer comprises:

a buffer providing the data of the buffer input line to the buffer output line when the buffer enable signal is in the activated state; and a control unit receiving the reference control signal and maintaining the activated state of the buffer enable signal when the period of the reference control signal is shorter than the reference period.

16. The semiconductor memory device of claim 15, wherein the control unit comprises:

unidirectional delay means for activating the buffer enable signal in response to a leading edge of an input auxiliary signal produced from the reference control signal, maintaining the activated state of the buffer enable signal when the period of the reference control signal is shorter than the reference period and deactivating the buffer enable signal in response to a lagging edge of the input auxiliary signal when the period of the reference control signal is longer than the reference period.

17. The semiconductor memory device of claim 9, wherein the semiconductor memory device is flash memory.

18. A semiconductor memory device, comprising:

a memory array including a plurality of memory cells arranged in a matrix formed by rows and columns;

an X-decoder for decoding a certain row address and, selecting a row of the memory array;

an Y-decoder for decoding a certain column address and, selecting a column of the memory array;

a page buffer for latching data read from the memory array and providing the data to a buffer input line in response to an output signal of the Y-decoder; and a data output buffer providing the data from the buffer input line to a buffer output line when the data output buffer is in an activated state, wherein the data output buffer receives a reference control signal and, when a period of the reference control signal is shorter than a reference period, the data output buffer is maintained in the activated state for the entire period of the reference control signal, wherein the data output buffer comprises:

a control unit adapted to generate a buffer enable signal in response to the reference control signal, the buffer enable signal remaining in the activated state when the period of the reference control signal is shorter than the reference period; and a buffer unit adapted to provide the data from the buffer input line to the buffer output line when the buffer enable signal is in the activated state.

19. The semiconductor memory device of claim 18, wherein the data output buffer maintains the buffer unit in the activated state regardless of the state of the reference control signal when the period of the reference control signal is shorter than the reference period, and activates the buffer unit in response to the reference control signal when the period of the reference control signal is longer than the reference period.

20. The semiconductor memory device of claim 19, wherein, when the period of the reference control signal is longer than the reference period, the data output buffer activates the buffer unit in response to a leading edge of the reference control signal and deactivates the buffer unit in response to a lagging edge of the reference control signal.

21. The semiconductor memory device of claim 18, wherein the control unit comprises unidirectional delay means for: activating the buffer enable signal in response to a leading edge of an input auxiliary signal produced from the reference control signal; maintaining the activated state of the buffer enable signal when the period of the reference control signal is shorter than the reference period; and deactivating the buffer enable signal in response to a lagging edge of the input auxiliary signal when the period of the reference control signal is longer than the reference period.

22. The semiconductor memory device of claim 21, wherein the buffer unit blocks provision of the data to the buffer output line when the buffer enable signal is deactivated.

23. The semiconductor memory device of claim 18, wherein the semiconductor memory device is a flash memory.

24. A semiconductor memory device comprising:
a memory array including a plurality of memory cells arranged in a matrix formed by rows and columns;
an X-decoder for decoding a certain row address and, selecting a row of the memory array;
an Y-decoder for decoding a certain column address and, selecting a column of the memory array; and
a data output buffer providing data which are received from a buffer input line read from a memory cell of the memory array specified by the X-decoder and the Y-decoder to a buffer output line when the data output buffer is in an activated state,
wherein the data output buffer receives a reference control signal and is maintained in the activated state regardless of a state of the reference control signal when a period of the reference control signal is shorter than a reference period.

25. The semiconductor memory device of claim 24, wherein the data output buffer is activated in response to the reference control signal when the period of the reference control signal is longer than the reference period.

* * * * *